United States Patent
Hsu et al.

(10) Patent No.: US 7,025,661 B2
(45) Date of Patent: Apr. 11, 2006

(54) CHEMICAL MECHANICAL POLISHING PROCESS

(75) Inventors: Chia-Lin Hsu, Tai-Nan (TW); Teng-Chun Tsai, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/711,392

(22) Filed: Sep. 16, 2004

(65) Prior Publication Data

US 2006/0057944 A1 Mar. 16, 2006

(51) Int. Cl.
*B24B 1/00* (2006.01)

(52) U.S. Cl. .......................... 451/41; 451/59; 438/631

(58) Field of Classification Search ............... 451/36, 451/37, 41, 57, 59; 438/633, 639, 629, 626, 438/687, 693, 631, 634; 435/6
See application file for complete search history.

(56) References Cited

U.S. PATENT DOCUMENTS

| | | | |
|---|---|---|---|
| 4,944,836 A | 7/1990 | Beyer et al. | |
| 5,676,587 A * | 10/1997 | Landers et al. | 451/57 |
| 6,573,173 B1 | 6/2003 | Farkas et al. | |
| 2002/0193050 A1 | 12/2002 | Sharan | |
| 2003/0013306 A1 * | 1/2003 | Tsai et al. | 438/692 |
| 2003/0098446 A1 * | 5/2003 | Puppe et al. | 252/500 |
| 2003/0124862 A1 | 7/2003 | Miyairi et al. | |
| 2003/0129838 A1 | 7/2003 | Cadien et al. | |
| 2003/0143851 A1 | 7/2003 | Cadien et al. | |
| 2003/0203705 A1 | 10/2003 | Leng | |
| 2003/0228753 A1 * | 12/2003 | Hau-Riege et al. | 438/639 |
| 2004/0116052 A1 * | 6/2004 | Chen et al. | 451/57 |
| 2004/0171265 A1 * | 9/2004 | Ye et al. | 438/692 |
| 2004/0266183 A1 * | 12/2004 | Miller et al. | 438/687 |
| 2005/0090104 A1 | 4/2005 | Yang et al. | |

* cited by examiner

*Primary Examiner*—Jacob K. Ackun, Jr.
(74) *Attorney, Agent, or Firm*—Winston Hsu

(57) ABSTRACT

A high throughput chemical mechanical polishing process is disclosed. A substrate having thereon a top bulk metal layer and a lower barrier layer is prepared. The top bulk metal layer is polished at a substantial constant removal rate to expose the barrier layer by utilizing a first platen and first slurry being selective to the barrier layer. The exposed barrier layer is then polished by using a second platen and second slurry. The first slurry has a copper to barrier polishing selectivity of greater than 30.

7 Claims, 3 Drawing Sheets

CHEMICAL MECHANICAL POLISHING PROCESS

BACKGROUND OF INVENTION

1. Field of the Invention

The present invention relates generally to the field of semiconductor manufacturing, and more particularly, to a copper/barrier chemical mechanical polishing (CMP) process.

2. Description of the Prior Art

In the process of fabricating integrated circuits, it is necessary to periodically planarize the wafer surface. One technique for planarizing the surface of a wafer is chemical mechanical polishing (CMP). In CMP processing, a wafer is placed face down on a rotating platen. The wafer, held in place by a carrier or polishing head, independently rotates about its own axis on the platen. Typically, the head is a floating polishing head with a flexible membrane. On the surface of the platen is a polishing pad over which there is dispensed a layer of aqueous polishing slurry. Ordinarily, the slurry chemistry, which is essential to proper polishing, consists of a colloidal solution of silica particles in a carrier solution.

Copper damascene or copper dual damascene technique combined with copper CMP are known in the art. In a conventional copper dual damascene process, a dielectric layer is deposited onto a substrate, patterned, and etched back such that trenches, vias, and other recessed regions etched into the dielectric layer represent the desired metal interconnection pattern. Barriers and copper are then sequentially deposited/sputtered over the entire surface of the device, filling the recessed regions and blanketing the surface of the dielectric layer. The bulk copper layer and barrier layer are then polished back to a degree such that the Cu/barrier structure becomes electrically isolated within the recessed regions etched out of the dielectric material. For reliability concerns, the aforesaid bulk copper layer is not removed or buffed off in one step, but usually in two steps with different removal rates, according to the prior art.

FIG. 1 depicts a cross-sectional view of a semiconductor wafer 10 having a typical dual damascene structure therein. As shown in FIG. 1, the dual damascene structure formed within a dielectric layer 20 is composed of via hole 22 and trench 23. A conductive layer or an underlying device 14 is formed in a dielectric layer 12 beneath via hole 22. A chemical mechanical polished copper layer 24 fills the trench 23 and via hole 22. A barrier layer 25 is disposed on interior surface of the dual damascene structure 11 to avoid copper diffusion, which usually causes a leakage current.

U.S. Pat. No. 6,573,173 to Farkas et al. discloses a method for forming a copper interconnection using a multi-platen CMP process. The method taught in this patent includes the steps of (1) forming an interconnect material comprising a top bulk metal layer and a lower barrier layer over a semiconductor substrate; (2) polishing an upper portion of the bulk metal layer at a first removal rate (at least 1000 angstroms per minute) using a first platen (ex. IC 1000 or IC 1010 from Rodel); (3) polishing remaining lower portion (<2000 angstroms) of the bulk metal layer using a second platen at a second removal rate that is smaller than the first removal rate; and (4) polishing the barrier layer using a third platen. According to this patent, the second platen is different from the first platen.

However, the prior art copper CMP process provided in U.S. Pat. No. 6,573,173 has some disadvantages. First, to avoid slurry cross-contamination, a wet cleaning process is recommended and is performed at a station located between the first platen and the second platen. Secondly, according to this patent, in order to maximize the throughput of the system, it is important to keep the polishing time of Step 1 approximately equal to the polishing time of Step 2, which just makes things complicated. A computer coupled to the CMP tool for monitoring polishing times of Step 1 and Step 2 is thus required to achieve the purpose of balancing the polishing times between the two polishing steps. Further, the use of high down force in Step 1 might cause crushing or scratching of the underlying porous low-k dielectrics. Moreover, when performing this prior art copper CMP process, at least three platens are required, which means additional maintenance fee and extra cost of parts.

In light of the foregoing, there is a constant need in this industry to provide an improved copper CMP process with sufficient reliability, increased throughput and relatively low cost.

SUMMARY OF INVENTION

It is therefore a primary objective of the present invention to provide an improved copper/barrier CMP process to solve the above-described prior art problems.

According to the claimed invention, a high-throughput chemical mechanical polishing process is disclosed. A substrate having thereon a top bulk metal layer and a lower barrier layer is prepared. The top bulk metal layer is polished at a substantial constant removal rate to expose the barrier layer by utilizing a first platen and first slurry being selective to the barrier layer. The exposed barrier layer is then polished by using a second platen and second slurry. The first slurry has a copper to barrier polishing selectivity of greater than 30, preferably above 100.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention is directed to a method of forming reliable interconnects of integrated circuits, more specifically to a copper/barrier chemical mechanical polishing process applied during the back end fabrication of integrated circuits with inlaid copper interconnects. It is to be understood that the term "copper" used hereinafter means copper or any suitable copper alloys known in the art unless otherwise indicated. The advantages of this invention at least include an improved throughput and relatively lower cost at the stage of CMP.

Figure 1:
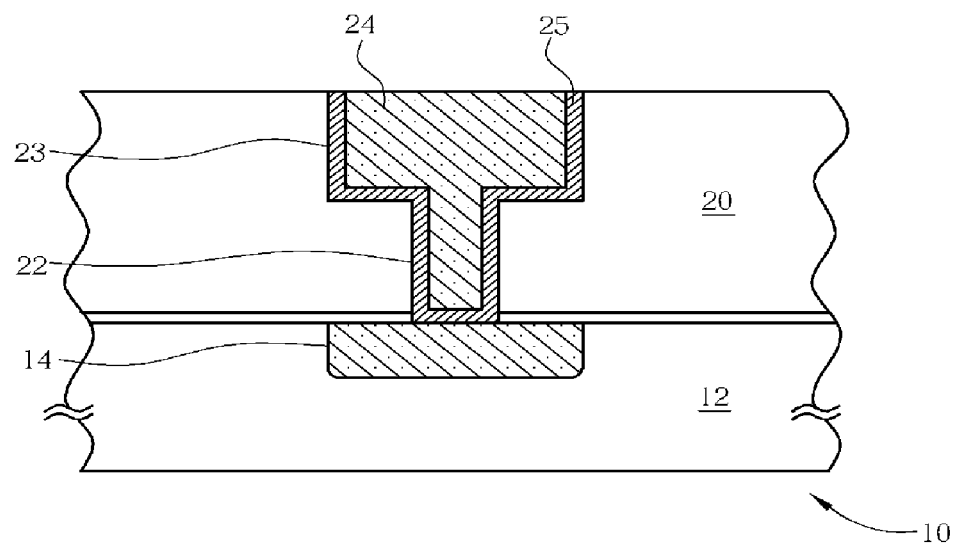
FIG. 1 is a schematic diagram illustrating an enlarged cross-sectional view of a portion of a semiconductor wafer having a typical dual damascene structure therein.
Figure 2:
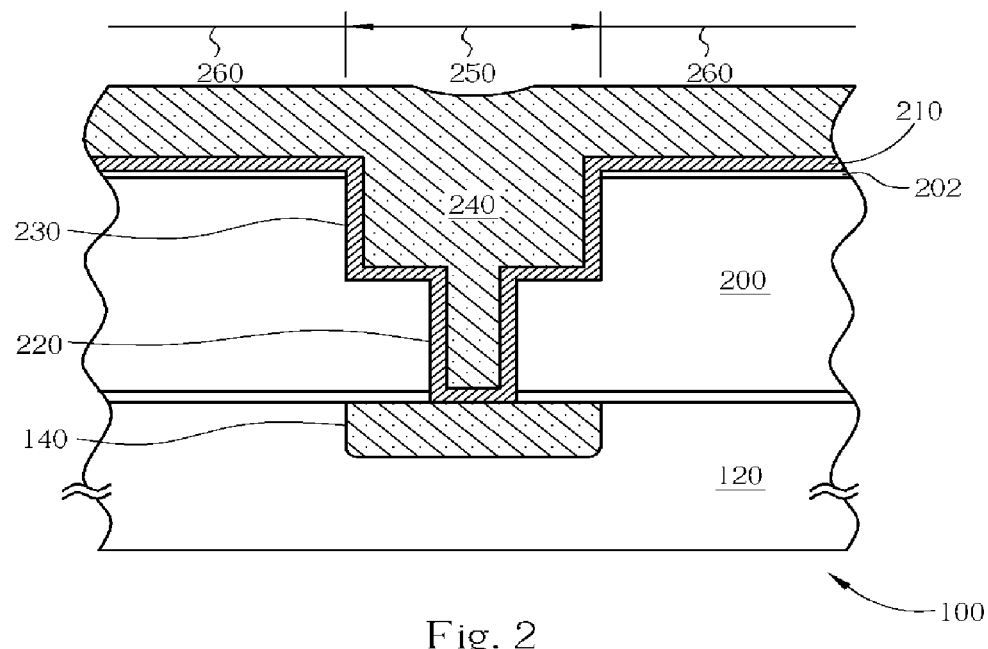
FIG. 2 is a schematic diagram illustrating a cross section of a substrate disposed thereon a top bulk copper layer and a lower barrier layer prior to the performance of the present invention CMP method.

For the purpose of explanation, referring initially to FIG. 2, a cross section of a substrate or semiconductor wafer 100 disposed thereon a top bulk copper layer 240 and a lower barrier layer 210 prior to the performance of the present invention CMP method is demonstrated. As shown in FIG. 2, the barrier layer 210 is formed on the interior surface of a recessed damascene region 250 and on the uppermost surface areas 260 of the dielectric layer 200. Examples of the barrier layer 210 include tantalum, tantalum nitride, titanium, titanium nitride, nickel nitride or the like. The dielectric layer 200 may comprise any suitable low-k dielectrics (k: dielectric constant<3) known in the art, and a layer of capping material 202 laminated at the top. The capping material 202 may be silicon carbide or silicon nitride, but not limited thereto. The thickness of the top bulk copper layer 240 is greater than 2000 angstroms.

The recessed damascene region 250 includes but not limited to a trench 230 and via 220 communicating with the trench 230. It is understood that in another case a single damascene structure such as a single via or single trench may apply. Via 220 communicates with an underlying device 140 that is insulated by the dielectric layer 120. The underlying device 140 may be a metal interconnect. In another embodiment, the underlying device 140 may be, for example, a poly gate of a MOS device or a diffusion region implanted into a semiconductor body.

Figure 3:
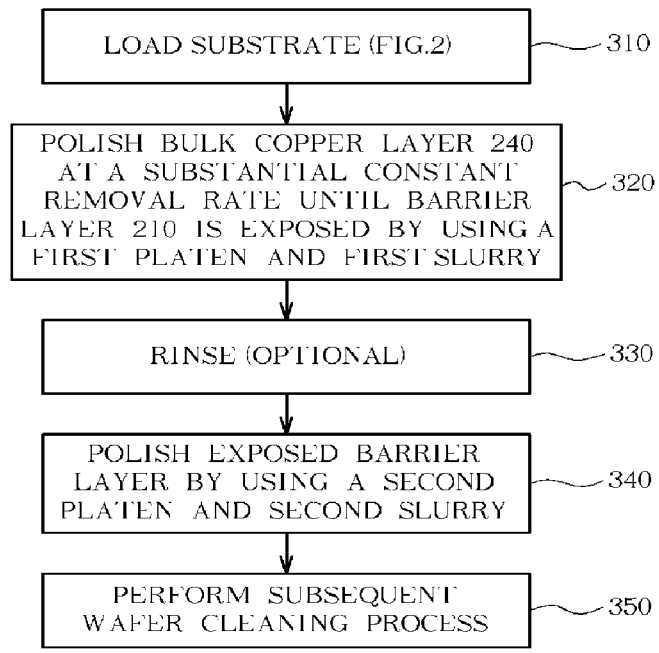
FIG. 3 is a flow chart showing the salient steps of the CMP process in accordance with this invention.

Please refer to FIG. 3 and briefly back to FIG. 2. FIG. 3 is a flow chart showing the salient steps of the CMP process according to this invention. In Step 310, the substrate 100 to be polished as set forth in FIG. 2 is loaded onto a carrier of a CMP tool that may be commercial available from Applied Materials, Inc. For example, the CMP tool may be a Mirra CMP system. According to one preferred embodiment of the present invention, the CMP tool is equipped with two platens such as IC 1000 or IC 1010 CMP pad manufactured by Radel.

Next, in Step 320, the top bulk copper layer 240 of the substrate is polished using a first platen over which there is dispensed a first slurry that is selective to the underlying barrier layer 210. It is worthy noted that the copper removal rate in Step 320 is kept at a substantial constant in the range of about 3000 angstroms per minute to 12,000 angstroms per minute (high removal rate). By doing this, CMP throughput is improved. The first slurry may be alumina-based slurry or silica-based slurry. Most importantly, the first slurry has a "copper to barrier selectivity" that is greater than 30, more preferably greater than 100. The aforesaid "copper to barrier selectivity" is defined as a ratio of the removal rate of copper to that of barrier. A typical down force ranging between 2 and 6 pounds per inch (psi) is applied between the wafer and the first platen. However, since high-selectivity slurry is used in Step 320, a higher down force or polishing pressure may be applied.

Figure 4:
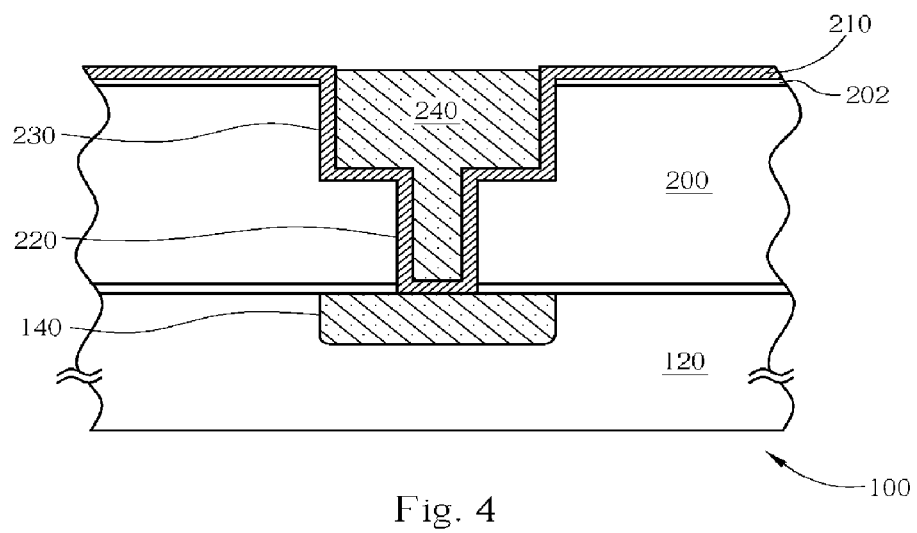
FIG. 4 and FIG. 5 are schematic cross-sectional diagrams illustrating the interconnect structures represented at various stages of processing in accordance with FIG. 3.

FIG. 4 demonstrates a schematic cross sectional view of the substrate 100 after the polishing step 320. As shown in FIG. 4, the top bulk copper layer 240 and any remaining copper residue on the barrier layer 210 are selectively removed.

Still referring to FIG. 3, in Step 330, a subsequent wafer rinse process is optionally performed in order to avoid cross contamination. Upon removal from the first platen, the substrate or wafer 100 may be rinsed with deionized water or any suitable wet cleaning chemistry when in transfer between the first platen and the second platen.

Figure 5:
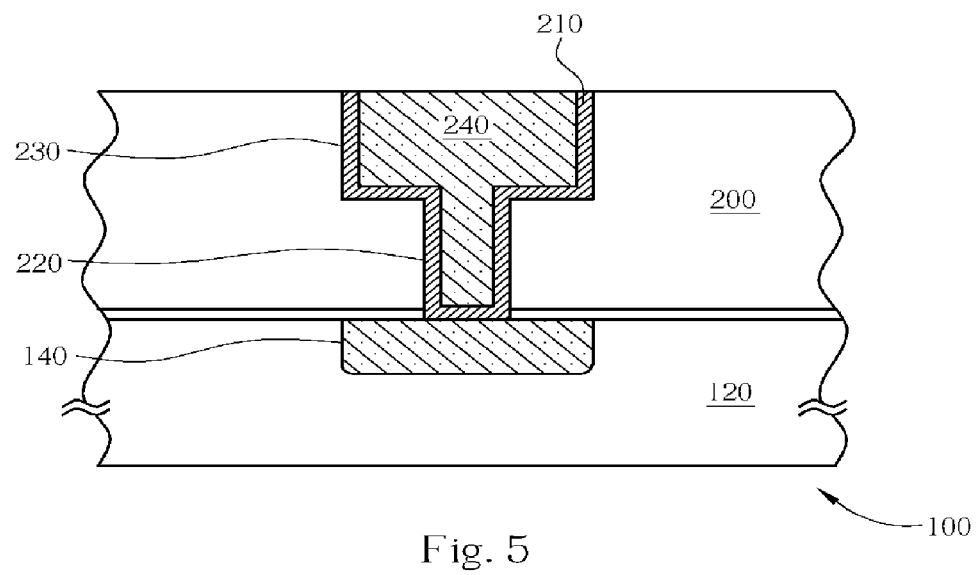

In Step 340, the exposed barrier layer 210 is polished by using a second platen and second slurry. The second slurry is preferably comprised of compositions capable of efficiently removing the barrier layer 210 at a relatively lower pressure (~1 psi). Such slurry may be available from Rodel. It would be advantageous to have selective removal of the barrier layer 210 to capping material 202 and to copper 240 in the second step polishing. FIG. 5 demonstrates a schematic cross sectional view of the substrate 100 after the second polishing step 340. The barrier layer 210 is selectively removed, while the dishing of copper is minimized. In Step 350, the wafer or substrate 100 is subjected to subsequent cleaning process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chemical mechanical polishing (CMP) process comprising:

providing a CMP tool having a first polishing platen and a second polishing platen;

providing a substrate having thereon a top metal layer stacked directly on a lower barrier layer;

placing said substrate on said first polishing platen with said top metal layer in contact with said first polishing platen;

dispersing, onto said first polishing platen, a first slurry being selective to said barrier layer;

polishing said top metal layer on said first polishing platen at a substantial constant removal rate, wherein an entire thickness of said top metal layer is polished at said constant removal rate and said substrate is not removed from said first polishing platen until said barrier layer is exposed; and after removing said top metal layer, placing said substrate on said second polishing platen and polishing said exposed barrier layer by using said second polishing platen and a second slurry.

2. The chemical mechanical polishing process according to claim 1 wherein said first slurry has a copper to barrier polishing selectivity of greater than 30.

3. The chemical mechanical polishing process according to claim 2 wherein said first slurry has a copper to barrier polishing selectivity of above 100.

4. The chemical mechanical polishing process according to claim 1 wherein said first slurry contains alumina.

5. The chemical mechanical polishing process according to claim 1 wherein said second slurry contains alumina.

6. The chemical mechanical polishing process according to claim 1 wherein said first slurry contains silica.

7. The chemical mechanical polishing process according to claim 1 wherein said second slurry contains silica.

* * * * *